US008828750B2

(12) United States Patent
Nystrom et al.

(10) Patent No.: US 8,828,750 B2
(45) Date of Patent: Sep. 9, 2014

(54) HIGHLY INTEGRATED WAFER BONDED MEMS DEVICES WITH RELEASE-FREE MEMBRANE MANUFACTURE FOR HIGH DENSITY PRINT HEADS

(71) Applicant: Xerox Corporation, Norwalk, CT (US)

(72) Inventors: Peter J Nystrom, Webster, NY (US); Peter M Gulvin, Webster, NY (US); Paul W Browne, Champaign, IL (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/875,262

(22) Filed: May 1, 2013

(65) Prior Publication Data

US 2013/0241999 A1 Sep. 19, 2013

Related U.S. Application Data

(62) Division of application No. 11/693,209, filed on Mar. 29, 2007, now Pat. No. 8,445,271.

(51) Int. Cl.
*H01L 21/00* (2006.01)
*B41J 2/135* (2006.01)

(52) U.S. Cl.
USPC ............................................ 438/21; 347/44

(58) Field of Classification Search
USPC .................................. 347/54; 216/27; 438/21
See application file for complete search history.

(56) References Cited

U.S. PATENT DOCUMENTS

| | | | | |
|---|---|---|---|---|
| 6,312,108 | B1 | 11/2001 | Kato | |
| 6,568,794 | B2 * | 5/2003 | Yamanaka et al. | 347/54 |
| 6,705,708 | B2 | 3/2004 | Murai | |
| 7,566,118 | B2 | 7/2009 | Bibl et al. | |
| 2002/0027576 | A1 | 3/2002 | Yamanaka et al. | |
| 2002/0076875 | A1 | 6/2002 | Wasa et al. | |
| 2004/0031773 | A1 * | 2/2004 | Silverbrook | 216/27 |
| 2005/0099467 | A1 | 5/2005 | Bibl et al. | |
| 2006/0139407 | A1 | 6/2006 | Umeda et al. | |
| 2007/0002092 | A1 | 1/2007 | Kitakami et al. | |
| 2008/0020573 | A1 | 1/2008 | Birkmeyer et al. | |
| 2008/0036059 | A1 | 2/2008 | Pohl et al. | |
| 2009/0213187 | A1 | 8/2009 | Kitakami et al. | |

FOREIGN PATENT DOCUMENTS

| | | |
|---|---|---|
| EP | 1 748 500 | 1/2007 |
| JP | 2000-52544 | 2/2000 |
| JP | 2001-072073 | 3/2001 |
| JP | 2002-052705 | 2/2002 |
| JP | 2006-187934 | 7/2006 |

OTHER PUBLICATIONS

Williams, K.R.; Gupta, K; Wasilik, M.; "Etch Rates for Micromachining Processing—Part II," Journal of Microeleotromechanical Systems, vol. 12, No. 6, pp. 781-778, Dec. 2003.

* cited by examiner

*Primary Examiner* — Stephen Meier
*Assistant Examiner* — Carlos A Martinez

(57) ABSTRACT

A method of fabricating a MEMS inkjet type print head and the resulting device is disclosed. The method includes providing a driver component and separately providing an actuatable membrane component, the actuatable membrane component being formed in the absence of an acid etch removing a sacrificial layer. The separately provided actuatable membrane component is bonded to the driver component and a nozzle plate is attached to the actuatable membrane component subsequent to the bonding. Separately fabricating the components removes the need for hydrofluoric acid etch removal of a sacrifical layer previously required for forming the actuatable membrane with respect to the driver component.

5 Claims, 5 Drawing Sheets

FIG. 3C
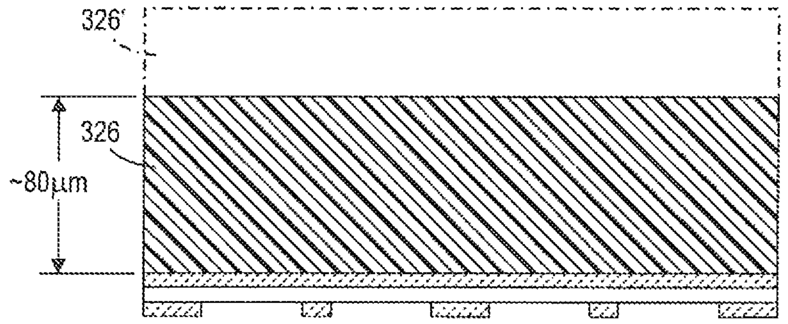
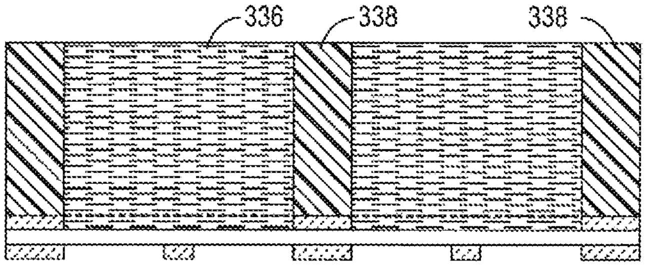
FIG. 3D

FIG. 4A (PRIOR ART)
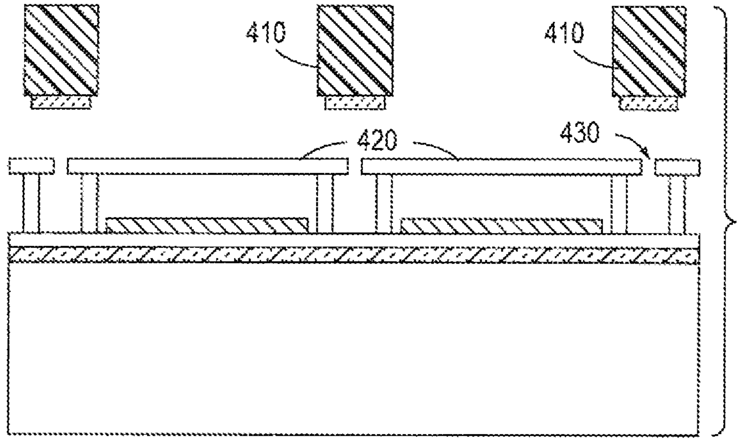
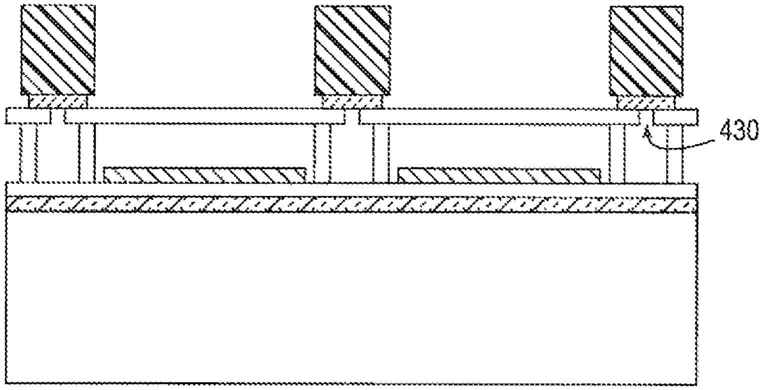
FIG. 4B (PRIOR ART)

HIGHLY INTEGRATED WAFER BONDED MEMS DEVICES WITH RELEASE-FREE MEMBRANE MANUFACTURE FOR HIGH DENSITY PRINT HEADS

CROSS REFERENCE TO RELATED APPLICATION

This application is a divisional application of U.S. Ser. No. 11/693,209, filed Mar. 29, 2007, now U.S. Pat. No. 8,455,271.

FIELD OF THE EMBODIMENTS

The present invention generally relates to integration of a driver substrate and a micro-electromechanical system (MEMS) membrane, and more particularly, integration of these components in a MEMS type inkjet print head.

BACKGROUND OF THE EMBODIMENTS

Heretofore, fabrication of a MEMS inkjet print head presented difficulties by virtue of the very components being joined. In particular, the MEMS inkjet print head incorporates a MEMS membrane device and a driver substrate, each formed with processes that can be detrimental to the other.

Traditional MEMS membrane devices can be fabricated using thin film surface micromachining techniques. For example, polysilicon layers are deposited over sacrificial silicon glass layers and the sacrificial layers are dissolved through a multitude of etch holes to allow the etchant to flow underneath the membranes. This etch process can affect required passivation of microelectronic components and the required holes need to be hermetically sealed after the etch release in some cases to prevent the device from malfunctioning. The aggressive chemical etch is typically performed with hydrofluoric acid (HF), which limits material choices for the designer. Further, use of the chemical etch complicates an integration of MEMS devices with traditional microelectronic components such as a substrate driver used in the MEMS inkjet print head. In addition, released devices can be difficult to process with traditional microelectronic techniques creating yield loss or restricted design options.

Conventional circuit driver substrates designed as CMOS devices are commonly employed to drive transducers and reduce input/output lines. These can be complex assemblies of thin films passivated with silicon oxides. If this type of device is exposed to a strong etchant, such as HF, it might no longer function. While steps can be taken to protect these passivation layers, other MEMS processes, particularly high temperature processes such as polysilicon deposition and annealing, can adversely impact the operation of transistor circuits. This is also aggravated by compound yield effects of additional microelectronic layers. Accordingly, CMOS and MEMS present a challenge to integrate.

FIGS. 4A and 4B depict s me basic features of a known MEMS inkjet print head and are provided to illustrate differences between the known heads and that of the exemplary embodiments.

In the known polysilicon membrane design of a MEMS inkjet print head, a larger, more complex structure 410 is used between adjacent membranes 420. These structures are used for sealing hydrofluoric acid etch release holes 430 in the membrane and for tolerance adjustments between membranes. In the exemplary embodiments described herein, a thinner, less complex fluid wall can be formed, and there are no holes in the membrane structure.

In order to form a print head device, the free membranes must be very small and at a very high density. For 600 nozzles per inch, the print head must have a pitch of 42.25 μm. This does not leave much room for sealing and alignment of the layers between each ejector nozzle.

Thus, there is a need to overcome these and other problems of the prior art and to provide a method and apparatus for a MEMS electrostatic inkjet print head in which the electrostatic membrane and drive electrode are fabricated on separate wafers prior to bonding the wafers together in an inkjet print head.

SUMMARY OF THE EMBODIMENTS

In accordance with the present teachings, a method of fabricating a MEMS inkjet type print head is provided.

The exemplary method can include providing a driver component, separately providing an actuatable membrane component, the actuatable membrane component formed in the absence of an acid etch removing a sacrificial layer, bonding the separately provided actuatable membrane component to the driver component, and attaching a nozzle plate to the actuatable membrane component subsequent to the bonding.

In accordance with the present teachings, a MEMS type inkjet print head is provided. The exemplary device can include a driver component and a MEMS component separately fabricated from the driver component, the MEMS component formed in the absence of an acid etch removing a sacrificial layer. Bonding features are provided to operatively join the driver component and the MEMS component, and a nozzle plate is attached to the MEMS component.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIGS. 3A through 3D depict an assembly process of a fluidic membrane component in accordance with embodiments of the present teachings; and FIG. 4A is an exploded view and FIG. 4B is an assembled view of a known print head structure.

DESCRIPTION OF THE EMBODIMENTS

Reference will now be made in detail to the exemplary embodiments of the invention, examples of which are illustrated in the accompanying drawings. However, one of ordinary skill in the art would readily recognize that the same principles are equally applicable to, and can be implemented in devices other than inkjet printers, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents. Wherever possible, the same reference numbers will be used throughout the drawings to refer to the same or like parts.

Embodiments pertain generally to MEMS inkjet print heads. The MEMS inkjet print head is a high speed, high density follow-on technology utilizing ink printing. More particularly, electrostatic micro-electro mechanical systems ("MEMS") inkjet print heads can be configured to break off ink drops in a precise and controlled manner.

An electrostatic MEMS membrane and drive circuit can be fabricated using silicon wafer fabrication techniques, and are separately fabricated prior to integration into the print head. The exemplary structure and methods include integration of MEMS components with traditional microelectronic components such as CMOS drivers.

Figure 1A:
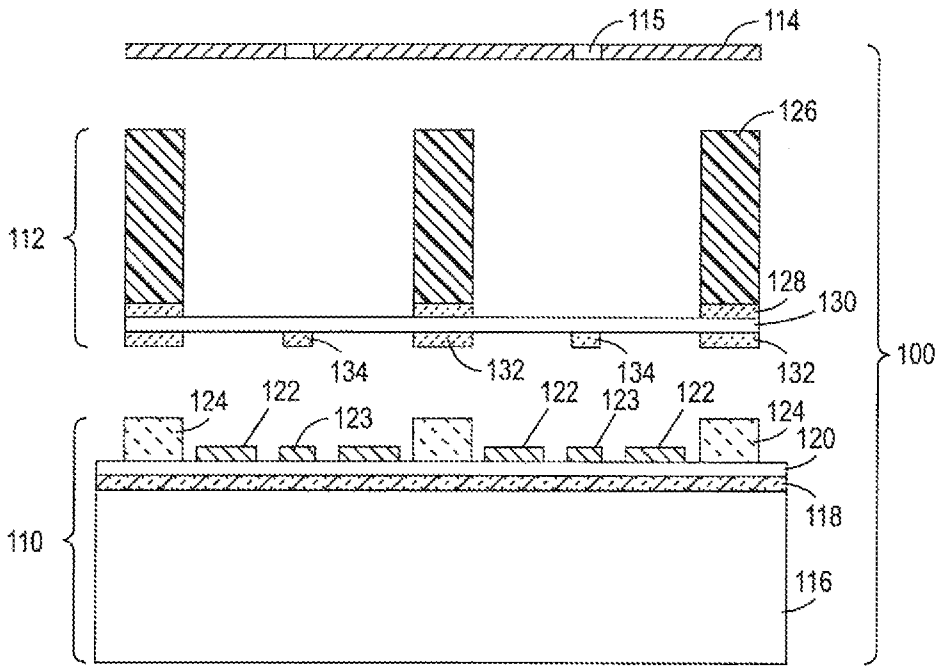
FIG. 1A depicts an exploded view of exemplary components of a print head assembly in accordance with embodiments of the present teachings.
Figure 1B:
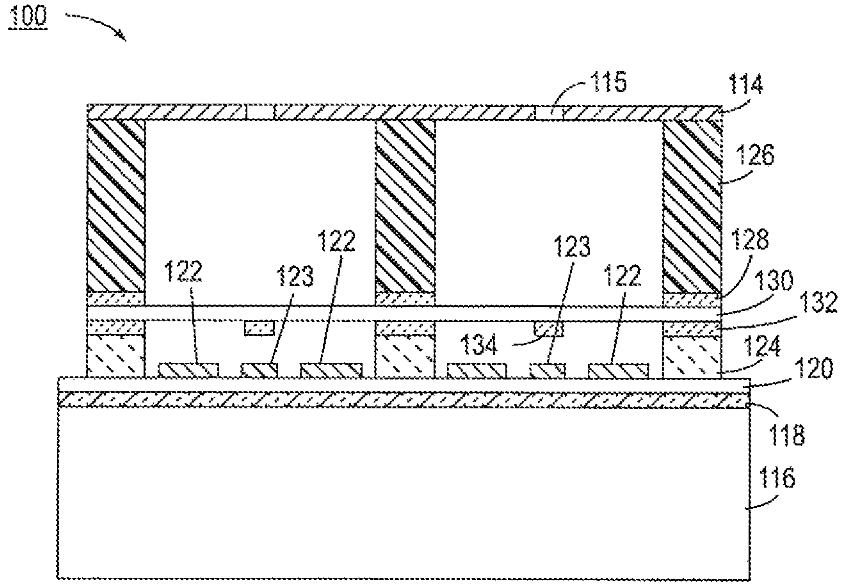
FIG. 1B depicts an assembled print head in accordance with embodiments of the present teachings.

FIG. 1A illustrates an exemplary exploded view of a MEMS inkjet print head 100 in accordance with an embodiment. FIG. 1B illustrates an assembled view of the MEMS inkjet print head of FIG. 1A. it should be readily apparent, to those of ordinary skill in the art that the MEMS inkjet print head 100 depicted in FIGS. 1A and 1B represents a generalized schematic illustration and that other components may added or existing components may be removed or modified.

The MEMS inkjet print head 100 depicted in FIGS. 1A and 1B includes a driver component 110, a fluid membrane component 112, and a nozzle plate 114. Each of these components can include further subcomponents as will be described herein.

Essentially, the MEMS inkjet print head 100 of the exemplary embodiments can be defined by a separately fabricated driver component 110 and membrane component 112, where the components are joined subsequent to their separate fabrications. A completed MEMS inkjet print head includes the nozzle plate 114 through which a liquid, such as ink or the like is dispensed.

As depicted in FIGS. 1A and 1B, the driver component 110 includes a wafer substrate 116, a CMOS layer 118 on the substrate, a passivation dielectric 120 formed on the CMOS surface 118, a membrane electrode 122, ground potential electrode 123, and bonding features 124 formed on the passivation dielectric.

The membrane component 112 includes, for example, an SOI wafer having a silicon wafer substrate 126, an oxide layer 128 formed on a surface of the substrate 126, and a device (membrane) layer 130 formed on the oxide layer 128. In addition, bonding features 132, 134 can be patterned on the device layer 130 for bonding with corresponding bonding features 124 of the driver component 110. As illustrated, the bonding features 132, 134 of the membrane component can be formed on a surface of the device layer 130 facing the bonding features 124 of the driver component 110.

It will be appreciated that the nozzle plate 114 can be constructed as know in the art for dispensing drops of fluid in response to actuation of the membrane component 112 by the driver component 110. In particular, the nozzle plate 114 can have a plurality of apertures 115 formed therein for dispensing a fluid from the print head 100.

Turning now to the dispensing of fluid from the nozzle plate 114 in the completed print head 100, a fluid such as ink (not shown) can be ejected from the apertures 115 in the nozzle plate 114. When a drive signal is applied to the microelectromechanical system (MEMS) membrane 130, it moves towards membrane electrode 122, decreasing the pressure in the ink cavity above and pulling ink into the cavity. When the drive signal is turned off or decreased, the MEMS membrane 130 returns to its original position, increasing the pressure in the cavity above and causing ink to be ejected through apertures 115 in nozzle plate 114.

The driver component 110 is fabricated as illustrated by way of example in FIGS. 2A-2E. Although a series of fabrication steps are described, it will be appreciated that various steps may be added or removed according to fabrication parameters. Further, although the driver component 110 is described particularly in connection with a CMOS device driver wafer, this is not intended to be limiting of the exemplary embodiments. Accordingly, the driver component 110 can also be built on a plain bare silicon or glass substrate.

Figure 2A:
FIGS. 2A through 2E depict an assembly process of a driver component in accordance with embodiments of the present teachings.
Figure 2B:
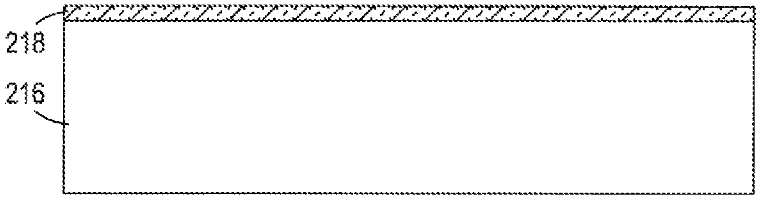
Figure 2C:
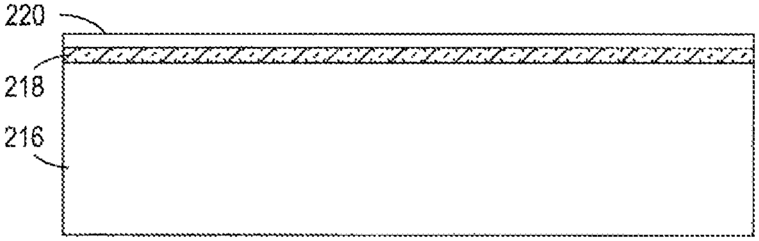

As shown in FIG. 2A, a silicon substrate wafer 216 is provided as a starting material for the driver component 110. in FIG. 2B, a CMOS layer 218 is formed on a surface of the silicon substrate wafer 216. Depositing of the CMOS layer 218 can include multiple masks and layers as is known in the art. In FIG. 2C, a passivation dielectric layer 220 is formed on the CMOS layer 218. Typically, the passivation layer 220 can be formed of silicon dioxide; however, this can be varied according to fabrication requirements. Other materials that can be used for passivation layer 220 can include silicon nitride, silicon dioxide with small amounts of nitrogen, and hafnium-based high-k dielectrics.

Figure 2D:
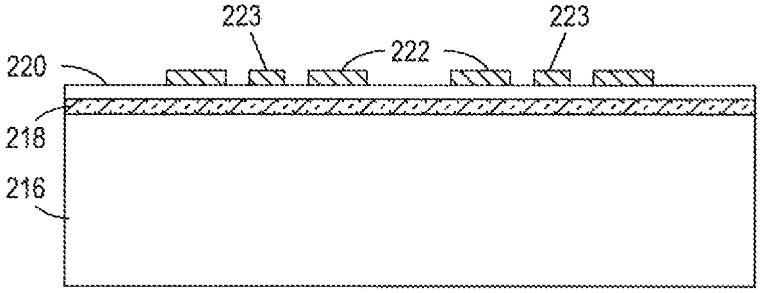

As shown in FIG. 2D, an electrode 222 can be formed on the passivation dielectric 220. The electrode 222 forms the counterelectrode of a capacitive membrane (130 of FIGS. 1A and 1B) of the membrane component 112 and can be recessed below bonding features 224 formed intermediate the electrodes 222. It will be appreciated that the term "a" membrane electrode can refer to a pattern of electrodes. For example, a ground potential electrode 223 can be positioned intermediate the electrodes 222 in order correspond to or align with features of the membrane component 112 as will be described. It will be appreciated that the electrodes 222 can be doped polysilicon or any other conductor. For example, the electrodes 222 can be aluminum, copper, ITO, or the like, and will be compatible with the base wafer processing. Previously, use of these types of electrodes was not thought to be possible since virtually all reactive metals are dissolvable in hydrofluoric acid. However, because the exemplary embodiments eliminate use of hydrofluoric acid etching and can incorporate the described metals, it is expected that the metal electrodes 222 can be applied directly to an upper surface of a microelectronic circuit, such as a CMOS driver array. One of ordinary skill in the art will understand suitable multi-level poly and metal processes applicable to the exemplary embodiments.

Figure 2E:
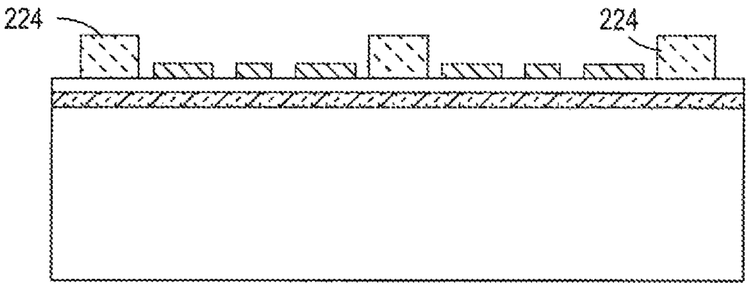

Referring to FIG. 2E, bonding features 224 can be formed on a surface of the passivation dielectric. The electrodes 222 can be recessed below bonding features 224, thereby defining a gap height between the passivation dielectric 220 of the driver component 110 and the membrane component 112.

The bonding features 224 can be patterned glass features applied before or after the electrode layer 222. It will be appreciated that the manufacturing process can vary according to process constraints and device design.

The driver component 110 can also include a planar oxide or a surface that has been mechanically polished to provide a flat, uniform substrate surface. The mechanical polish can be, for example, a chemical mechanical polish (CMP) as known in the art. Typically, the planar oxide surface can be formed when the driver component 110 includes an oxide thereon. Since the driver component 110 can be separately fabricated from the membrane component 112, deposition of oxides can be tightly controlled and precise thicknesses can be achieved and maintained.

Figure 3A:
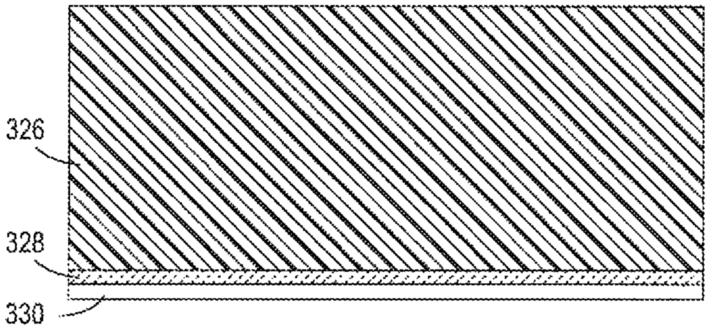
Figure 3B:
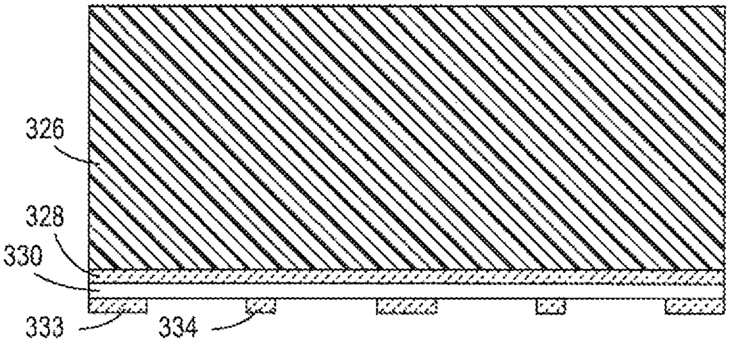

Turning now to FIGS. 3A-3D, an exemplary fabrication of the membrane component 112 is depicted. The SOI wafer is depicted in FIG. 3A and includes a silicon substrate 326, oxide layer 328 and device layer 330, assembled as known in the art. The device layer 330 can be a silicon device of about 2 μm thickness. The mating oxide layer 328 can be patterned to form a receiving oxide film 333 for wafer to wafer bonding on a surface of the device layer 330 facing the bonding features 224 of the driver component 110. This mating oxide layer can also be used to form an oxide dimple 334 on the membrane 330 that could otherwise riot be formed with traditional deposition methods. As an alternative, the dimple can be formed directly on the electrode 222 of FIGS. 2D, 2E.

The device layer 330 can be, for example, the active layer of a SOI wafer. Although the thickness is not critical to an understanding of the embodiments, an active layer of about 2 μm can typically be used.

It will be appreciated that the described structure is not limited to SOI wafer materials, and is further compatible with polysilicon membrane technology. For polysilicon membrane technology, a blank silicon wafer is used as a base. A suitable oxide is deposited and then a 2 μm (or desired thickness) of polysilicon is applied. Patterning and other depositions coincide with that described in connection with SOI.

Once the device layer 330 is prepared for bonding, it can be optionally patterned since it remains exposed. This is an advantage not previously realized. In fact, by separately fabricating each of the driver component 110 and membrane component 112, and eliminating etching with hazardous materials such as hydrofluoric acid, many fabrication steps can be re-ordered to suit a particular design or foundry process.

As illustrated in FIG. 3C, a thickness of the membrane component 112 can be defined by back-grinding and/or polishing the silicon handle layer 326 to a desired thickness. Grinding and/or polishing can occur in one or more steps either alternately or sequentially. By way of example, a silicon handle layer 326 can be ground and/or polished to a thickness of about 80 μm.

As depicted in FIG. 3D, a deep etch can be performed on the silicon handle 326 and buried oxide layer 328 to expose the membrane layer 330. The deep etch results in the formation of fluid chambers 336 and fluid walls 338 surrounding the fluid chambers 338.

For deeper fluid chamber layers, the grinding, polishing and chamber etching can be performed prior to wafer bonding. For very thin fluid chamber layers or where the structure can become fragile due to its size, the driver component 110 and membrane component 112 can be bonded followed by the grinding, polishing, and etching. It will be appreciated that the order of fabrication is not critical, and is instead flexible because of the separate fabrication of each of the driver component 110 and membrane component 112.

The driver component 110 and the membrane component 112 can be bonded together with known wafer-to-wafer bonding techniques subsequent to their separate fabrication. In the exemplary embodiments, the bonding features 224 of the driver component 110 are fusion bonded to the bonding features 333 of the membrane component 112. Wafer-to-wafer bonding is a very accurate method for joining wafers together. A glass fusion bond is extremely strong, hermetic, and accurate. No additional materials need to be added, nor is there any squeeze out in the bond area. This type of bond is particularly suitable for the exemplary embodiments as it can use materials that can already be found on the wafer, and are a natural fit to the process. In addition, the process and material used are currently supported in the semiconductor industry by existing equipment suppliers.

Alternatives to glass fusion bond are acceptable for use in the exemplary embodiments and include gold diffusion bond, solder bond, adhesion bond, or the like.

The completed print head 100 includes the nozzle plate 114 provided on an exposed surface of the membrane component 112 as illustrated in FIGS. 1A and 1B. Typically, the nozzle plate 114 is applied to an assembled driver substrate component 110 and fluidic membrane component 112 which can be previously bonded together by glass fusion as described above. As an option, the nozzle plate 114 can be applied at the point where the individual die are packaged into a print head array. This selection is architectural and not limited by the choices of wafer processing described herein.

It will be appreciated by those of skill in the art that the aggressive wet hydrofluoric acid etch is eliminated from the exemplary methods described herein, allowing combinations of layers that wouldn't otherwise be feasible. For example, when wet hydrofluoric acid etching is used, nitride films can be required to protect underlying oxides from inadvertent removal. In these types of membrane devices, high electric fields can be generated during operation. These nitride films can build up charge, changing the electric fields and resulting forces, and are therefore less than an ideal material. By eliminating the wet acid etching, options available to manufacturers become much more diverse. By way of example only, thermal oxides or other nigh quality dielectrics can now be utilized to improve the performance of the MEMS type inkjet print head without risk of damage to the component materials during processing.

While the invention has been illustrated with respect to one or more exemplary embodiments, alterations and/or modifications can be made to the illustrated examples without departing from the spirit and scope of the appended claims. In particular, although the method has been described by examples, the steps of the method may be performed in a different order than illustrated or simultaneously. In addition, white a particular feature of the invention may have been disclosed with respect to only one of several embodiments, such feature may be combined with one or more other features of the other embodiments as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." And as used herein, the term "one or more of" with respect to a listing of items such as, for example, "one or more of A and B," means A alone, B alone, or A and B.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any an all sub-ranges between (and including) the minimum value of zero and the maximum value of 10, that is, any and all sub-ranges having a minimum value of equal to or greater than zero and a maximum value of equal to or less than 10, e.g., 1 to 5.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

The invention claimed is:

1. A MEMS type inkjet print head comprising:

a semiconductor substrate;

a CMOS layer on the substrate;

a driver component comprising a first portion, a second portion, a membrane electrode, wherein the membrane electrode comprises a material selected from the group consisting of aluminum, copper, and indium tin oxide (ITO);

a ground potential electrode interposed between the first portion of the membrane electrode and the second portion of the membrane electrode, wherein the ground potential electrode comprises a material selected from the group consisting of aluminum, copper, and ITO;

a MEMS component comprising:

release hole-free fluid membrane;

a first bonding feature and a second bonding feature each connected to the release hole-free fluid membrane, wherein the first and second bonding features connect the MEMS component and the driver component together;

a dimple connected to the release hole-free fluid membrane and interposed between the first bonding feature and the second bonding feature, wherein the first bonding feature, the second bonding feature, and the dimple comprise oxide;

a nozzle plate attached to the MEMS component;

a passivation layer on the CMOS layer, wherein the first and second portions of the membrane electrode and the ground potential electrode are on the passivation layer, a first portion of the passivation layer is directly interposed between the CMOS layer and the first portion of the membrane electrode, a second portion of the passivation layer is directly interposed between the CMOS layer and the second portion of the membrane electrode, and a third portion of the passivation layer is directly interposed between the CMOS layer and the ground potential electrode; and the driver component further comprises a third bonding feature connected to the first bonding feature and a fourth bonding feature connected to the second bonding feature; and the first and second portions of the membrane electrode are interposed between the third bonding feature and the fourth bonding feature.

2. The MEMS type inkjet print head of claim 1, wherein each of the first and second membrane electrode portions, the ground electrode, the first bonding feature, the second bonding feature, and the dimple are exposed at a location between the release hole-free fluid membrane and the CMOS layer.

3. The MEMS type inkjet print head of claim 2, wherein the first membrane electrode portion, the second membrane electrode portion, and the ground potential electrode are formed from a material that can be etched using hydrofluoric acid.

4. The MEMS type inkjet print head of claim 1, wherein the membrane electrode is exposed at a location between the release hole-free fluid membrane and the CMOS layer.

5. The MEMS type inkjet print head of claim 1, further comprising a dimple directly on the membrane electrode.

* * * * *